United States Patent [19]
Andrews et al.

[11] 4,147,889
[45] Apr. 3, 1979

[54] CHIP CARRIER

[75] Inventors: Daniel M. Andrews, San Marcos, Calif.; Joseph F. Merlina, Harrisburg, Pa.; John P. Redmond, Mechanicsburg, Pa.; William S. Scheingold, Palmyra, Pa.; George Ulbrich, Harrisburg, Pa.

[73] Assignee: AMP Incorporated, Harrisburg, Pa.

[21] Appl. No.: 882,300

[22] Filed: Feb. 28, 1978

[51] Int. Cl.² .............................................. H05K 7/20
[52] U.S. Cl. ........................ 174/52 FP; 174/16 HS; 357/81; 361/388
[58] Field of Search ...................... 174/52 FP, 16 HS; 357/81; 361/386, 388; 339/17 CF

[56]  References Cited
U.S. PATENT DOCUMENTS

| 3,801,728 | 4/1974 | Gallo et al. | 361/38 B X |
| 3,839,660 | 10/1974 | Stryker | 357/81 X |
| 3,846,734 | 11/1974 | Pauza et al. | 361/403 X |
| 3,865,458 | 2/1975 | Pauza et al. | 339/91 R |
| 3,877,064 | 4/1975 | Scheingold et al. | 361/408 X |
| 3,936,928 | 2/1976 | Hopp | 174/52 FP X |
| 3,958,195 | 5/1976 | Johnson | 357/81 X |
| 3,963,315 | 6/1976 | Bonis | 339/17 CF |
| 4,066,839 | 1/1978 | Cossatta et al. | 174/52 FP X |

Primary Examiner—J. V. Truhe
Assistant Examiner—D. A. Tone
Attorney, Agent, or Firm—Gerald K. Kita

[57] ABSTRACT

An improved chip carrier of thin dieletric deformed into a dish configuration provided with flexible mounting flanges on which are plated or bonded solderable conductive traces and paths together with plated or bonded heat sinks which may be referenced to ground potential, and which provides structural integrity.

4 Claims, 9 Drawing Figures

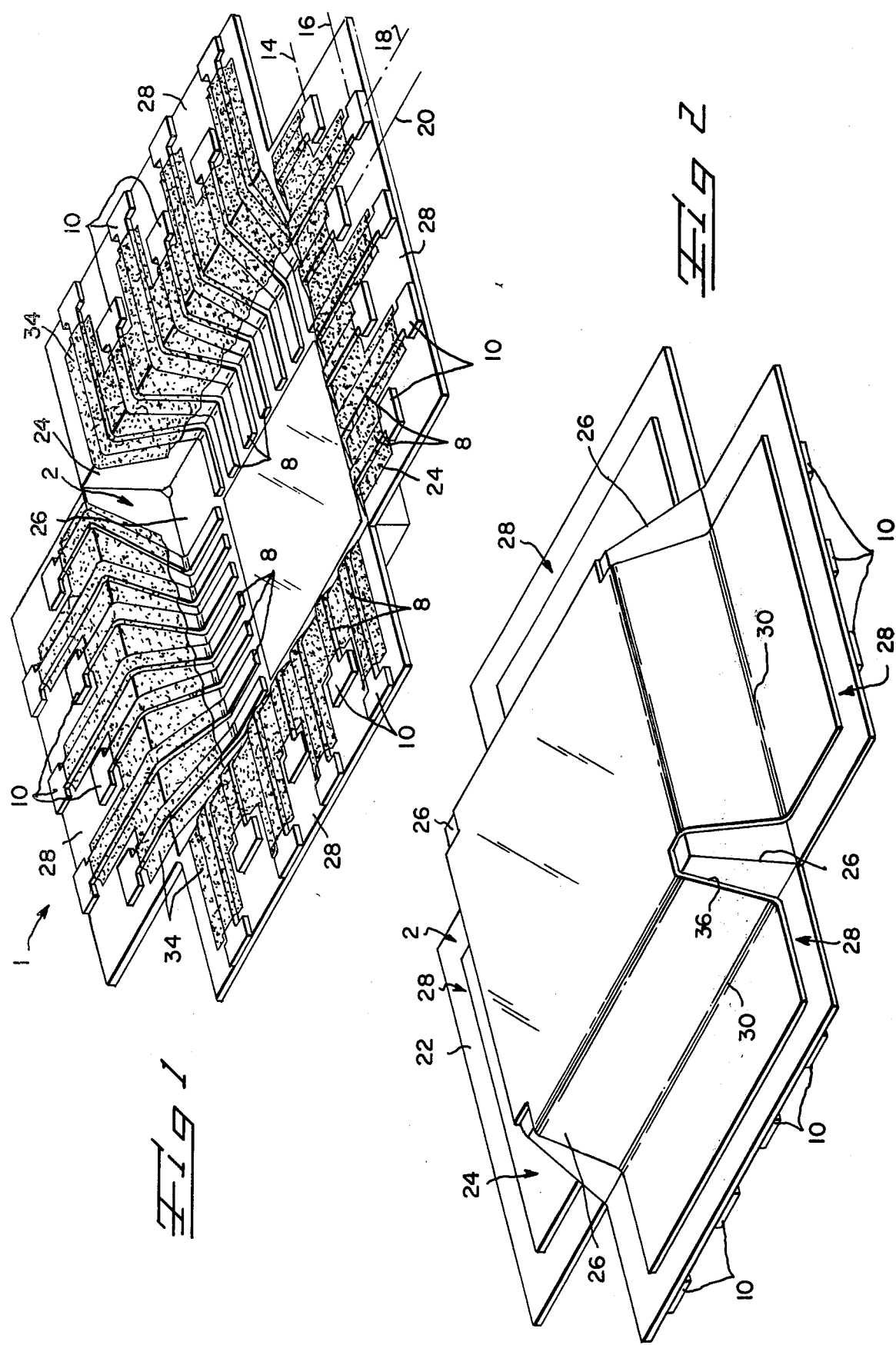

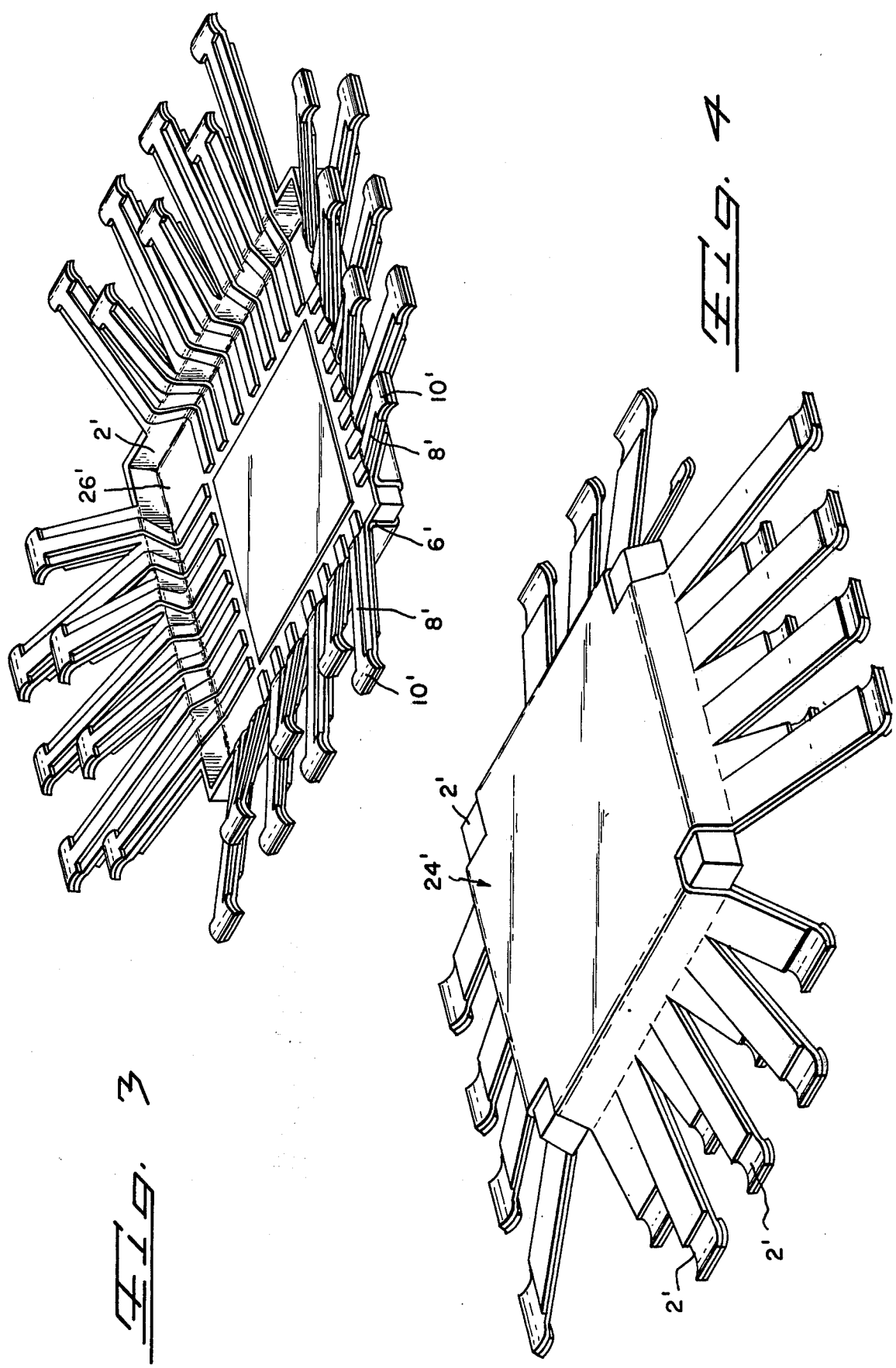

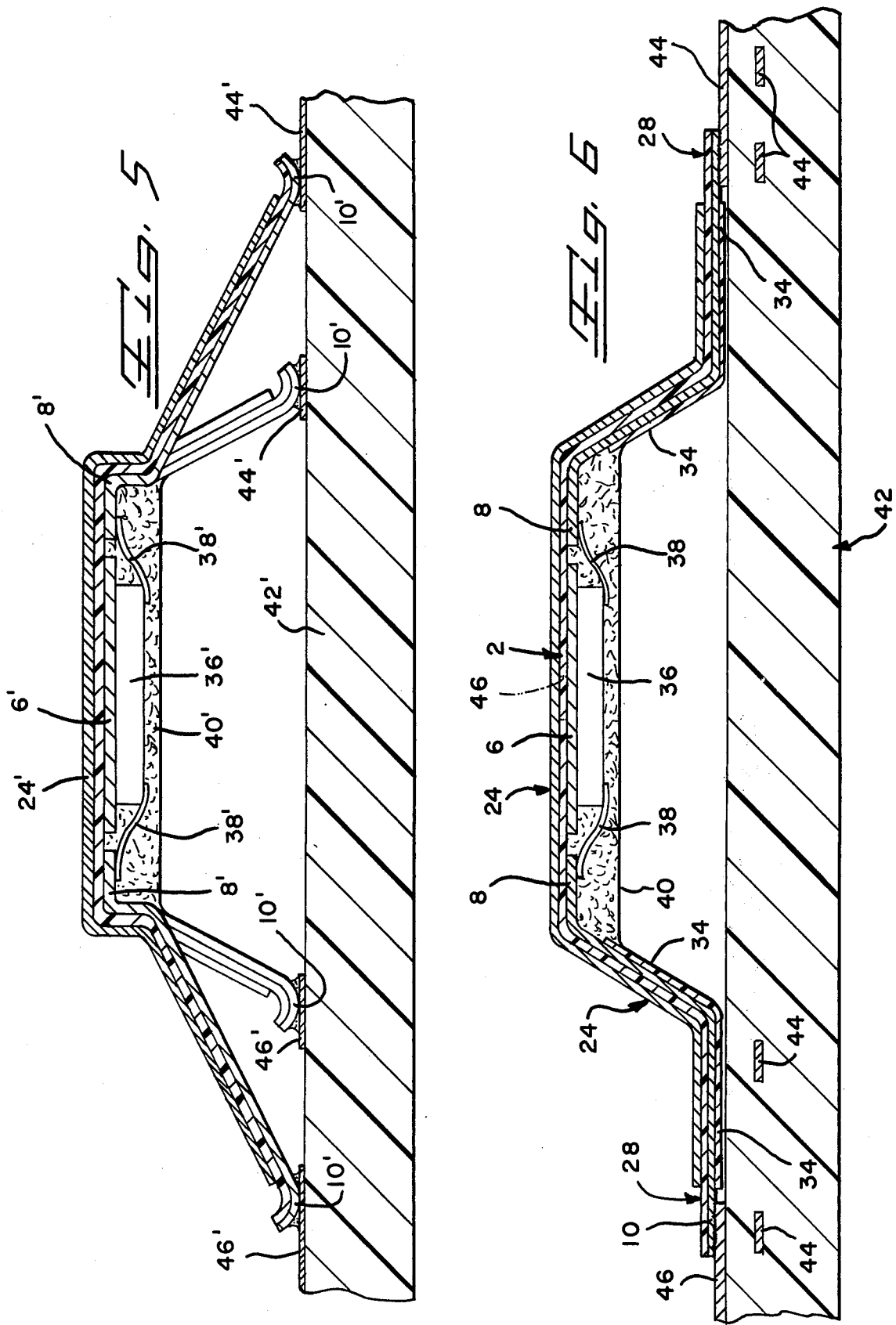

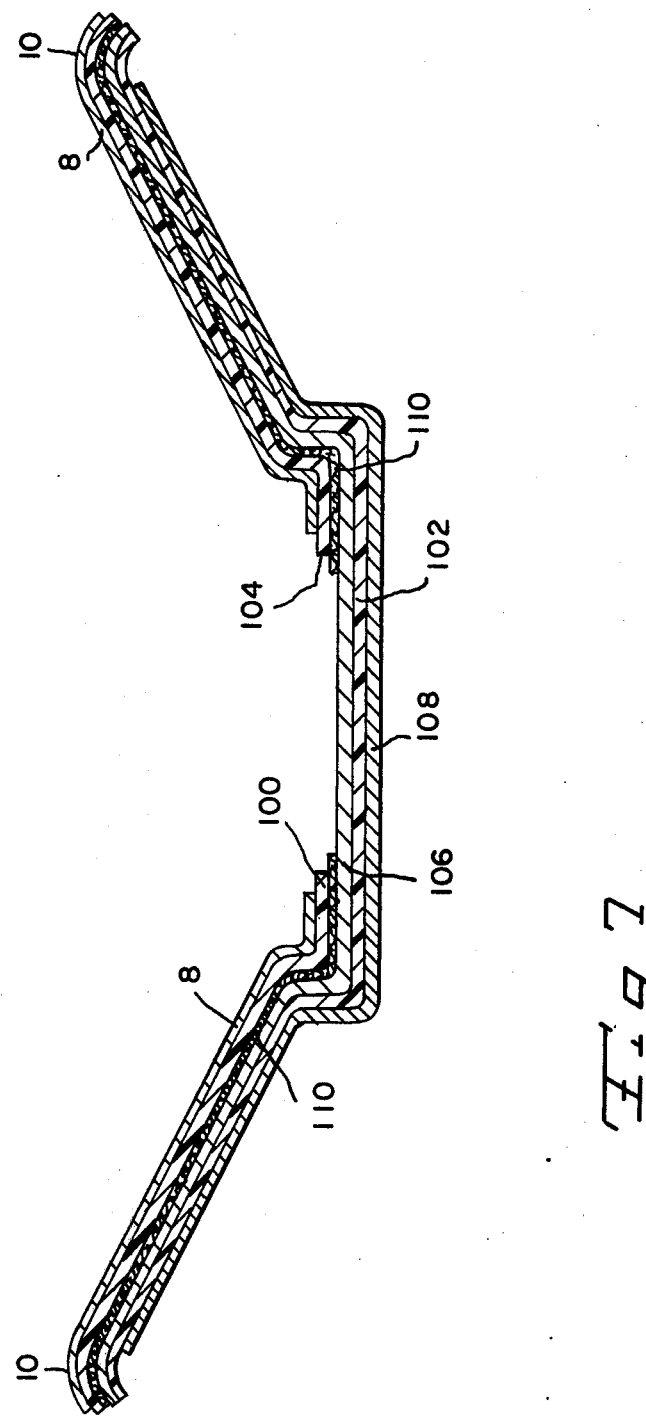

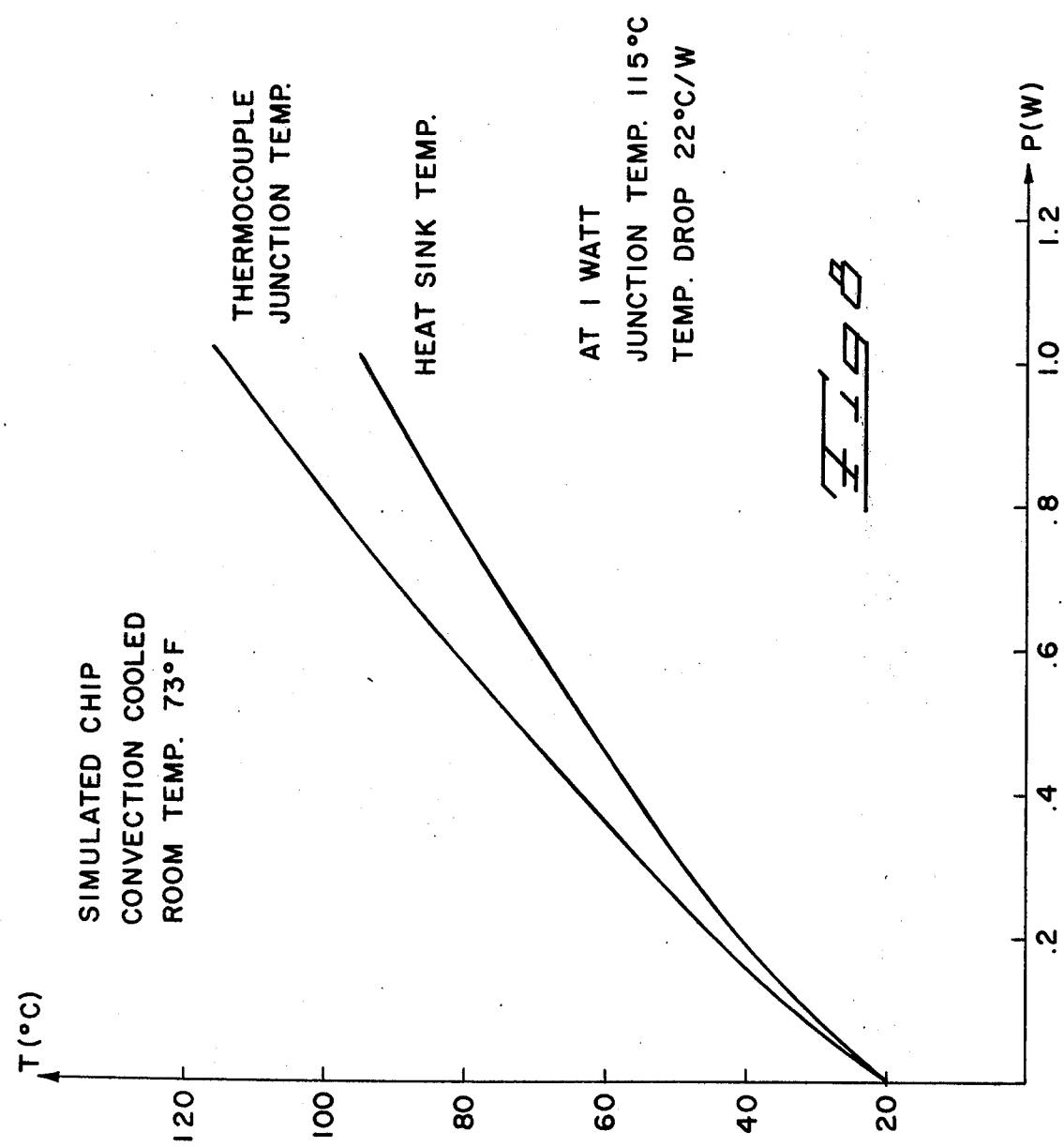

CHIP CARRIER

BACKGROUND

The present invention relates to a holding fixture or chip carrier for housing a semiconductor circuit chip. More particularly, this invention provides an inexpensive chip carrier having plated or bonded heat sinks and conductive traces capable of direct attachment to a circuit board.

Chip carriers include a molded dielectric base in the form of a tray for receiving the chip. Conductive traces for the chip are typically provided on a circuit board separately mounted on the tray as disclosed in U.S. Pat. No. 3,963,315. Alternatively, traces are provided by metal electrical contacts as disclosed in U.S. Pat. Nos. 3,877,064 and 3,846,734. The chip is held in place, for example, by a separate cover or by latches provided on the metal contacts, as disclosed in U.S. Pat. No. 3,865,458. Mounting the chip carrier to a circuit board is accomplished by plugging the metal contacts into plating lined holes or into miniature metal receptacles attached to the circuit board.

Due to the abating cost of integrated circuit chips and advancements in miniaturization, there is a need for changing the chip carriers because of their bulkiness and relatively high fabrication cost. Circuit boards without component receiving holes are now desired, particularly, when using multilayer circuit boards which eliminate plating lined holes except those used for communication between layers.

SUMMARY

The improved chip carrier according to the present invention is inexpensively fabricated from a thin dielectric, base plated with or to which are bonded conductive traces which are solderable or lead bondable to the chip leads. The base is formed into a dish shaped receptacle having a stiffly flexible rim provided by a series of flanges. The chip is received in the dish shape and attached to a heat sink therein; the dish shape is then inverted. The flanges are used for mounting the inverted base to a circuit board. Conductive paths on the flanges connect the traces to circuit paths on the circuit board. A heat sink is provided by relatively thick metal on the surface of the thin dielectric base. Since the conductive metal layer may cover the entire inverted surface of the base, the traces and the chip may be electrically shielded whenever the metal layer is referenced to a ground potential.

OBJECTS

An object of the present invention is to provide a chip carrier which is inexpensive and which provides a heat sink as well as conductive traces on mounting flanges integral with the carrier and mountable directly to a circuit board.

Another object of the present invention is to provide a chip carrier of thin dielectric deformed into a dish shape and having conductive traces and a heat sink plated or bonded thereon.

Another object of the present invention is to provide a chip carrier of thin dielectric deformed into a dish configuration provided with stiffly flexible rim flanges which mount the carrier to circuit board, the flanges having solderable conductive traces and paths plated or bonded thereon together with plated or bonded heat sinks which may or may not be referenced to ground potential.

Other objects and many advantages of the present invention may be derived from the following detailed description together with the accompanying drawings.

DRAWINGS

FIG. 1 is an enlarged perspective of an improved chip carrier according to the present invention.

FIG. 2 is an enlarged perspective illustrating the preferred embodiment shown in FIG. 1 in inverted orientation.

FIG. 3 is an enlarged perspective of an alternative embodiment according to the present invention.

FIG. 4 is an enlarged perspective of the embodiment of FIG. 3 illustrated in inverted orientation.

FIGS. 5 and 6 are each an enlarged elevation in section illustrating the assembly of an integrated circuit chip to the carrier with the carrier assembled to a circuit board.

FIG. 7 illustrates a cross section of a modification.

FIGS. 8 and 9 are graphs illustrating heat transfer characteristics of the present invention.

DETAILED DESCRIPTION

Figure 9:
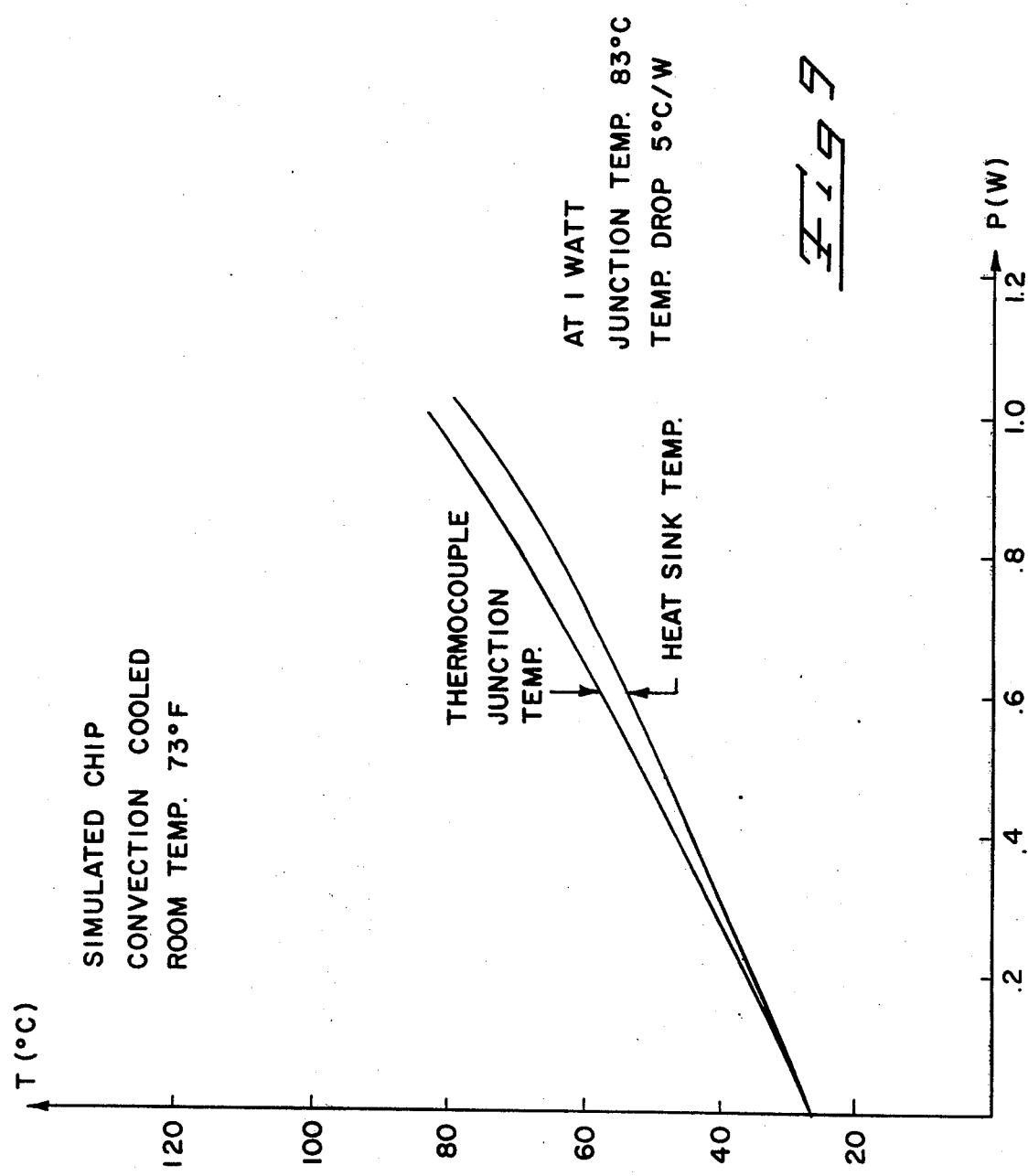

With more particular reference to FIGS. 1 and 2 of the drawings, there are shown more particularly at 1 a preferred embodiment of a chip carrier fabricated from a relatively thin dielectric such as 0.005 inch thick G10, a standard glass-filled circuit board material or dielectric materials with special properties, such as high temperature capability. Initially, the base 2 is of flat configuration and has a metal layer, which is preferably copper, plated or bonded on opposite sides or surfaces. More particularly, a first surface 4, to which is applied a central rectangular configured layer of copper, shown generally at 6 and comprising an internal heat sink. A plurality of copper traces, some of which are shown generally at 8, project outwardly from, and isolated from, the four sides of the heat sink 6. Each of the traces 8 terminate in an integral rectangular copper pad 10. The pads 10 of adjacent traces 8 are arranged in alternately staggered rows indicated by the center lines 14 and 16 spaced 0.100 inches apart. Adjacent pads 10 are on centerlines 18 and 20 perpendicular to the centerlines 14 and 16 and spaced on centerlines 0.050 inches apart. The traces 8 which join corresponding adjacent pads must also be spaced apart about 0.050 inches. Such spacing may differ adjacent to the side margins of the heat sink 6. As shown in FIG. 1, the traces 8 are separated by gaps from the side margins of the heat sink 6 and extend perpendicularly away therefrom. Many other configurations of the heat sink 6 are possible. If the heat sink is circular, then the traces 8 may radiate in any direction therefrom. More or less side margins may be provided on the heat sink 6. Corresponding traces 8 may project away from each of the side margins provided.

As shown more particularly in FIG. 2, the base 2 is shown inverted from its orientation shown in FIG. 1 with an inverted surface 22 thereof provided thereover with a backing of copper, shown more particularly at 24. All of the plated portions of the chip carrier 1 may be applied simultaneously in a single plating operation to reduce fabrication costs. Other fabrication techniques, well known in the art, such as laminating and etching can be used. Subsequent to plating the initially flat base member 2 is deformed into a dish configured receptacle as shown in FIGS. 1 and 2 providing a recessed bottom 26 on which the heat sink 6 is disposed, together with portions of the traces 8 adjacent to the heat sink. The copper backing 24 as well as the traces 8 are also bendable, upon deformation of the base 2, to conform to the dish configuration. Since a rectangular dish configuration is shown in FIG. 1, four sharp corner edges 26 are produced. In addition, the dish configuration is provided with an encircling rim provided by four rectangular flange sections 28. Flange sections 28 join the dish configuration along corresponding fold or bend lines 30 which require corresponding bending of the copper backing 24 and of the traces 8. The copper backing can only be deformed in two intersecting planes. Where the sharp corner edges 26 meet the corresponding pair of fold lines 30, three intersecting planes occur. The copper backing 24 must be receded from the corner edges 26 as shown by notched away portions 32 so as to prevent being deformed in more than two intersecting planes. Otherwise, the copper would tend to delaminate from the base 2.

To complete the assembly, reference is made to FIG. 6 taken in conjunction with FIG. 1. A thin layer of dielectric film such as Kapton is laminated over the traces 8 leaving exposed the pads 10 and also portions of the traces 8 adjacent to the heat sink 6. An integrated circuit chip shown generally at 36 is bonded to the internal heat sink 6 by soldering or by conductive epoxy or the like. Flying lead bonds shown generally at 38 connect conductive traces of the chip 36 with the corresponding traces 8 on the base member 2. Then the dish configuration is partially filled with a dielectric encapsulant 40 or other suitable potting material, such as epoxides, polyamides, or phenolics when used with phenolic material as the base 2, encapsulating the flying leads 38 and the chip 36 in the dish configuration. In addition, the heat sink 6 and portions of the traces 8 are also encapsulated in the dish configuration. Portions of the protective dielectric film 34 are also partially embedded in the epoxy 40. When the epoxy 40 is solidified, the assembly is ready for mounting to a circuit board. The assembly is inverted as shown in FIG. 6 and mounted, for example, to a circuit board shown generally at 42 having circuit paths 44 and 46 thereon. The pads 10 are exposed for soldering to the circuit paths 44 and 46 as desired. The chip carrier therefore is electrically mounted and assembled to the circuit board 42 without a need for plating lined apertures, which is highly desirable to prevent excessive consumption of the circuit board volume, or to prevent damage to internal circuit paths 44 in the board. In the assembly as shown in FIG. 6, the copper backing 24 provides an external heat sink of substantial surface area. The heat generated within the chip 36 is conducted to the internal heat sink 6 which transmits the heat through the relatively thin base 2 and into the external heat sink 24, which dissipates the heat. Because the base is relatively thin, direct contact of the internal heat sink 6 with the outer heat sink 24 is not deemed necessary. However, one or more optional aperture shown at 46 may be provided through the base material 4 prior to plating. Then upon plating, the deposited metal will fill each aperture 46 at the same time as plating forms the heat sinks 6 and 24. Thereby, the heat sinks 6 and 24 will be directly communicating.

As shown in FIG. 6, the rim or flange sections 28 allow mounting of the paths 10 to the circuit paths 44 and 46. Due to the thinness of the base 2, the flange sections are stiffly flexible and pivotable about the bend lines 30 to allow conformation to any irregularities in the surface of the circuit board 42.

As shown in FIGS. 3, 4, and 5, an alternative embodiment according to the present invention is in most respects similar to the previously described embodiment. This embodiment includes the internal heat sink 6', the external heat sink 24', the traces 8', and the pads 10' mounted to a modified base 2'. As shown, the dielectric material forming the base 2' is subjected to a stamping operation which first shears away the relatively thin dielectric around the pads 10' and traces 8'. Adjacent traces 8' and their pads 10' are individually flexible and pivotable. As shown in FIG. 4, the external heat sink 24' covers the back sides of the remaining base material which correspond with the individual separated leads 8'. Subsequent to shearing another stamping operation deforms the base 2' to a dish shape.

As shown in FIG. 5, a chip 36' is mounted to the internal heat sink 6' with the conductive traces of the chip being bonded by leads 38' to corresponding traces 8'. The dish configuration is then partially filled with encapsulate 40' encapsulating the chip 36', the leads 38', and portions of the traces 8' together with the heat sink 6'. The assembly is inverted and mounted to a modified circuit board 42' having circuit paths 44' and 46' to which corresponding pads 10' are soldered. Therefore, in this embodiment the rim sections of the base are divided into a plurality of individual flexible fingers which carry the traces and the pads.

The flexible fingers are compliant and accommodate differential expansion between the chip carrier and the circuit board 42'. A modification is shown in FIG. 7, wherein a first dielectric base portion 100 is formed into a dish configuration and is nestled and stacked with a second base portion 102 of dish configuration. The first dish configuration is provided with the traces 8 and pads 10. Instead of a heat sink 6, an aperture 104 is provided through the base 100. The second base portion 102 is provided with a heat sink 106 covering the entire top surface and another heat sink 108 covering the entire bottom surface. When the portions 100 and 102 are stacked together to form a composite base, a part of the heat sink 106 will be exposed in the aperture 104 for attachment thereto of a chip received freely in the aperture 104. The portions 100 and 102 are bonded together by "prepeg" a partially cured epoxy impregnated glass fiber cloth which is very thin, although the thickness is exaggerated as shown at 110. By heating the assembly, the prepeg will fully cure, and in the process, bond the portions 100 and 102 together.

FIG. 9 illustrates the temperature drop in degrees Centigrade per watt of the FIG. 7 embodiment.

FIG. 8 illustrates the corresponding temperature drop per watt of the FIG. 1 embodiment. The FIG. 7 embodiment produces better results because the heat sink 106 is actually a heat distribution layer, distributing the heat generated by a chip mounted thereon to the entire surface of the portion 102 before transferring heat to the outer heat sink 108.

Although preferred embodiments of the present invention are disclosed and shown in detail, other embodiments and modifications thereof which would be apparent to one having ordinary skill in the art is intended to be covered by the spirit and scope of the apended claims.

What is claimed is:

1. A chip carrier having a chip carrier base and a plurality of electrical leads carried on a first surface of said base, the improvement comprising:
   said base being formed of thin dielectric material shaped in a recessed chip receiving receptacle,
   said first surface on a bottom of said receptacle being coated with a first relatively thick layer of heat transmitting material for conducting heat from said chip through said relatively thin dielectric, and
   a second surface of said dielectric being coated with a second relatively thick layer of heat transmitting material, whereby heat is transferred from said bottom of said receptacle through said relatively thin dielectric and to said second layer of heat transmitting material.

2. The structure as recited in claim 1, wherein said base includes side portions extending outwardly of said bottom portion, and planar flange portions joined to said side portions, said leads projecting from said bottom portion and over said side portions, said leads being provided with enlarged pad portions secured on said flange portions.

3. The structure as recited in claim 2, wherein said pads are in a staggered arrangement.

4. In a chip carrier having a chip mounting base and a plurality of electrical leads carried on a first surface of said base, the improvement comprising:
   said base being formed of thin rigid dielectric and deformed in a recessed chip receiving receptacle having integral flexible flange portions thereon,
   a bottom of said receptacle having a plated or bonded layer of heat transmitting material for conducting heat from said chip through said relatively thin dielectric,
   said electrical leads being plated on or bonded to said first surface and being deformed together with said base in conformation with the shape of said recessed chip receiving receptacle,
   said electrical leads extending continuously over said first surface from adjacent said heat transmitting material and over said flexible flange portions,
   said flange portions being provided with enlarged pads integral with said electrical leads, and
   a second surface of said dielectric having a plated or bonded layer of heat transmitting material whereby heat is transferred from said first layer of heat transmitting material through said dielectric and to said second layer of heat transmitting material.

* * * * *